(12) United States Patent
Hsieh et al.

(10) Patent No.: US 9,947,588 B1
(45) Date of Patent: Apr. 17, 2018

(54) METHOD FOR MANUFACTURING FINS

(71) Applicant: UNITED MICROELECTRONICS CORP., Hsin-Chu (TW)

(72) Inventors: Ming-Shiou Hsieh, Chiayi County (TW); Chun-Yao Yang, Kaohsiung (TW); Shi-You Liu, Kaohsiung (TW); Rong-Sin Lin, Taichung (TW); Han-Ting Yen, Yunlin County (TW); Neng-Hui Yang, Hsinchu (TW); Tsai-Yu Wen, Tainan (TW); Ching-I Li, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/817,274

(22) Filed: Nov. 19, 2017

Related U.S. Application Data

(62) Division of application No. 15/294,792, filed on Oct. 17, 2016, now Pat. No. 9,859,164.

(51) Int. Cl.
*H01L 21/8234* (2006.01)
*H01L 21/265* (2006.01)
*H01L 21/02* (2006.01)
*H01L 21/324* (2006.01)

(52) U.S. Cl.
CPC ......... *H01L 21/823431* (2013.01); *H01L 21/02115* (2013.01); *H01L 21/02271* (2013.01); *H01L 21/265* (2013.01); *H01L 21/324* (2013.01); *H01L 21/823468* (2013.01); *H01L 21/823481* (2013.01)

(58) Field of Classification Search
CPC combination set(s) only.
See application file for complete search history.

(56) References Cited

U.S. PATENT DOCUMENTS

| | | |
|---|---|---|
| 9,431,521 B1 | 8/2016 | Cheng |
| 2015/0115267 A1 | 4/2015 | Gu |
| 2016/0218199 A1* | 7/2016 | Tsai ................. H01L 29/66803 |
| 2016/0240530 A1 | 8/2016 | Xie |
| 2016/0343846 A1* | 11/2016 | Cheng .............. H01L 21/28264 |

* cited by examiner

Primary Examiner — Mamadou Diallo
(74) Attorney, Agent, or Firm — Winston Hsu

(57) ABSTRACT

A method for manufacturing fins includes following steps. A substrate including a plurality of fins formed thereon is provided. At least an ion implantation is performed to the fins. A thermal process is performed after the ion implantation. An insulating layer is formed on the substrate, and the fins are embedded in the insulating layer. Thereafter, a portion of the insulating layer is removed to form an isolation structure on the substrate, and the fins are exposed from a top surface of the isolation structure. The insulating layer is formed after the ion implantation and the thermal process. Or, the isolation structure is formed before the ion implantation, or between the ion implantation and the thermal process.

8 Claims, 8 Drawing Sheets

METHOD FOR MANUFACTURING FINS

CROSS REFERENCE TO RELATED APPLICATIONS

This application is a division of application Ser. No. 15/294,792 filed on Oct. 17, 2016, now allowed, which is incorporated by reference herein in its entirety.

BACKGROUND OF THE INVENTION

1. Field of the Invention

The present invention relates to a method for manufacturing fins, and more particularly, to a method for manufacturing fins for fin field effect transistor (hereinafter abbreviated as FinFET) device.

2. Description of the Prior Art

Conventional planar metal-oxide-semiconductor (MOS) transistor has difficulty when scaling down to 65 nm and below. Therefore the non-planar transistor technology such as FinFET technology that allows smaller size and higher performance is developed to replace the planar MOS transistor.

In the prior art, the conventional FinFET device can be formed by the following steps: A silicon layer is patterned to form fins in the SOI substrate by any proper etching process. Then, a gate including an insulating layer such as a high dielectric constant (high-k) layer and a gate conductive layer is formed to cover portions of the fins. Next, ion implantation and anneal treatment are performed to form a source/drain in the fin film not covered by the gate. Since the manufacturing processes of the FinFET device are easily integrated into the traditional logic device processes, it provides superior process compatibility. More important, since the FinFET device increases the overlapping area between the gate and the fin structures, the channel region is more effectively controlled. This therefore reduces drain-induced barrier lowering (DIBL) effect and short channel effect, and the current between the source and the drain is increased. In addition, the channel region is longer under the same gate length, and thus the current between the source and the drain is increased.

However, needs for improving performance of the FinFET device is still to be satisfied. For example, fins are vulnerable and susceptible and thus defects are often found during the manufacturing processes. Therefore, method for manufacturing the fins is still in need of improvement.

SUMMARY OF THE INVENTION

According to an aspect of the present invention, a method for manufacturing fins is provided. The method includes following steps. A substrate including a plurality of fins formed thereon is provided and at least an ion implantation is performed to the fins. After the implantation, a thermal process is performed and followed by forming an insulating layer on the substrate. And the fins are embedded in the insulating layer. Thereafter, a portion of the insulating layer is removed to form an isolation structure on the substrate, and the fins are exposed from a top surface of the isolation structure.

According to an aspect of the present invention, another method for manufacturing fins is provided. The method includes following steps. A substrate including a plurality of fins formed thereon is provided, and an insulating layer is subsequently formed on the substrate. And the fins are embedded in the insulating layer. Next, a portion of the insulating layer is removed to form an isolation structure on the substrate, and the fins are exposed from a top surface of the isolation structure. At least an ion implantation is performed to the fins before or after forming the isolation structure. And a thermal process is performed after forming the isolation structure.

According to the methods for manufacturing the fins provided by the present invention, the insulating layer is formed after the ion implantation and the thermal process. Or, the isolation structure is formed before the ion implantation, or between the ion implantation and the thermal process. Consequently, stress generated by a "insulating layer formation-to-ion implantation-to-thermal process" sequential procedure is prevented. Consequently, stack fault caused by the stress is reduced and thus the vulnerable fins are protected, and the fins with superior quality ensure the FinFET performance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a method for manufacturing fins provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

FIGS. 1-3 and 8-10 are schematic drawings illustrating a method for manufacturing fins provided by a second preferred embodiment of the present invention, wherein FIG. 8 is a schematic drawing in a step subsequent to FIG. 3, FIG. 9 is a schematic drawing in a step subsequent to FIG. 8, and FIG. 10 is a schematic drawing in a step subsequent to FIG. 9.

FIGS. 1-3 and 12-15 are schematic drawings illustrating a method for, wherein

FIG. 12 is a schematic drawing in a step subsequent to FIG. 3,

FIG. 13 is a schematic drawing in a step subsequent to FIG. 12,

FIG. 14 is a schematic drawing in a step subsequent to FIG. 13, and

FIG. 15 is a schematic drawing in a step subsequent to FIG. 14.

DETAILED DESCRIPTION

Figure 1:
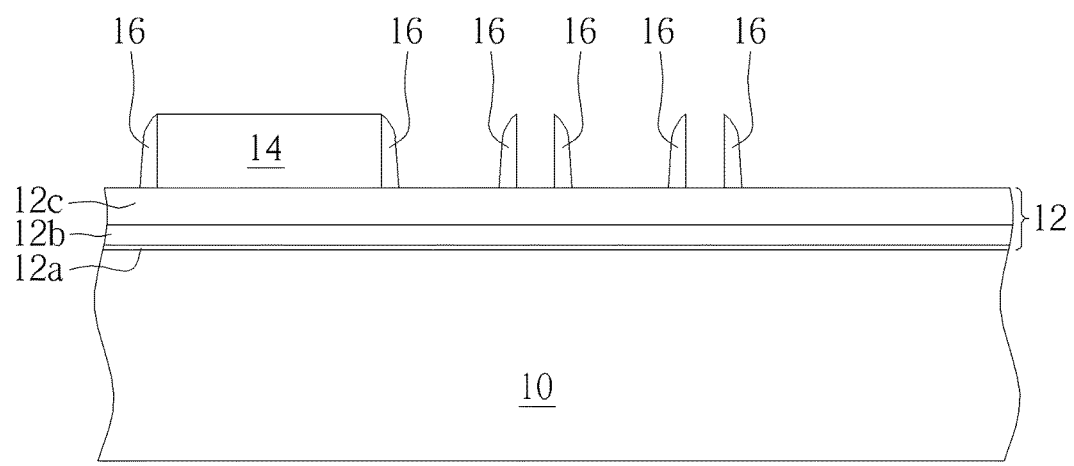

FIGS. 1-6 are schematic drawings illustrating a method for manufacturing fins provided by a first preferred embodiment of the present invention. Please refer to FIG. 1. According to the method for manufacturing fins provided by the first preferred embodiment, a substrate 10 is provided. The substrate 10 can include a silicon-on-insulator (SOI) substrate. It is well-known to those skilled in the art that the SOI substrate upwardly includes a silicon substrate, a bottom oxide (BOX) layer (not shown) and a semiconductor layer such as a single crystalline silicon layer formed on the BOX layer. However, for providing superior ground connection and thermal dissipation and for reducing interference and cost, the substrate 10 provided by the preferred embodiment also can include a bulk silicon substrate as shown in FIG. 1. A hard mask 12 is formed on the substrate 10, and the hard mask 12 preferably is a multilayer including, for example but not limited to, a silicon oxide layer 12a, a silicon nitride layer 12b and a silicon oxide layer 12c.

Please still refer to FIG. 1. Next, a plurality of mandrel patterns 14 are formed on the hard mask 12, the mandrel patterns 14 preferably includes amorphous silicon layer, but not limited to this. A plurality of spacer patterns 16 are then formed on sidewalls of the mandrel patterns 14 and followed by removing portions of the mandrel patterns 14. Consequently, the spacer patterns 16 are remained on the substrate 10, specifically on the hard mask 12, as shown in FIG. 1.

Figure 2:
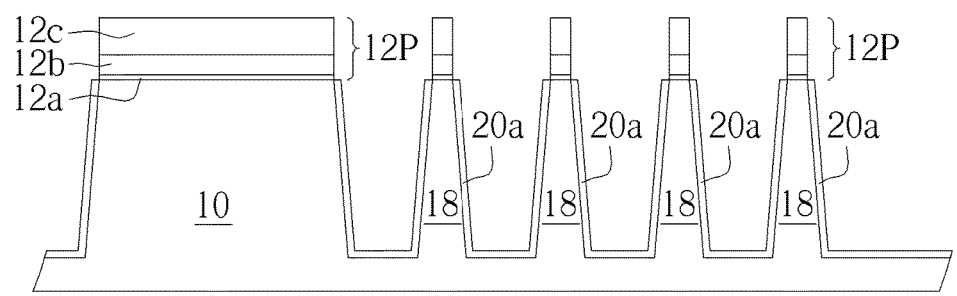

Please refer to FIG. 2. Next, the hard mask 12 is patterned through the spacer patterns 16, such that a patterned hard mask 12P is obtained as shown in FIG. 2. Thereafter, the substrate 10 is etched through the spacer pattern 16 and/or the patterned hard mask 12P. Consequently, a plurality of fins 18 are formed on the substrate 10. Then the spacer patterns 16 are removed. After forming the fins 18, a first protecting film 20a is formed to cover surfaces of the fins 18. The first protecting film 20a can be obtained by performing an in-situ steam generation (ISSG) oxidation process, and thus the first protecting film 20a can be an ISSG oxide layer, but not limited to this. It should be understood that the fins 18 are formed by the spacer self-aligned double-patterning (SADP method, also known as sidewall image transfer (SIT) method. However, the fins 18 can be formed by any other suitable method such as, for example but not limited to, photolithographic etching pattern (PEP) method or multi patterning method.

Figure 3:
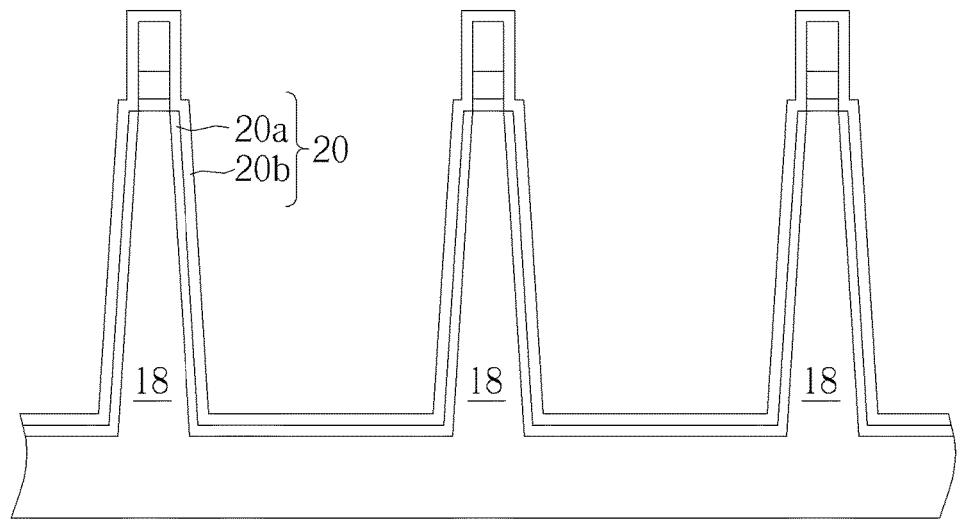

Please refer to FIG. 3, which is an enlarged view of a portion of FIG. 2. It is noteworthy that the substrate 10 can include region including the fins 18 and/or regions including other elements, however, only region including the fins 18 is shown in FIG. 3. As shown in FIG. 3, next, a fin cutting process is performed to selectively remove portions of the fins 18 from the substrate 10. It should be easily realized by those skilled in the art that the fins 18 can be removed depending on different product and/or process requirements, therefore the fin cutting process is not limited to this. After the fin cutting process, a second protecting film 20b is formed to cover surfaces of the fins 18. The second protecting film 20b can be formed by performing a high aspect ratio process (HARP), and thus the second protecting layer 20b can be a HARP oxide layer. Additionally, the first protecting film 20a and the second protecting film 20b construct a protecting layer 20 on the fins 18 as shown in FIG. 3. In other words, the present invention provides an oxide multilayer serving as the protecting layer 20.

Figure 4:
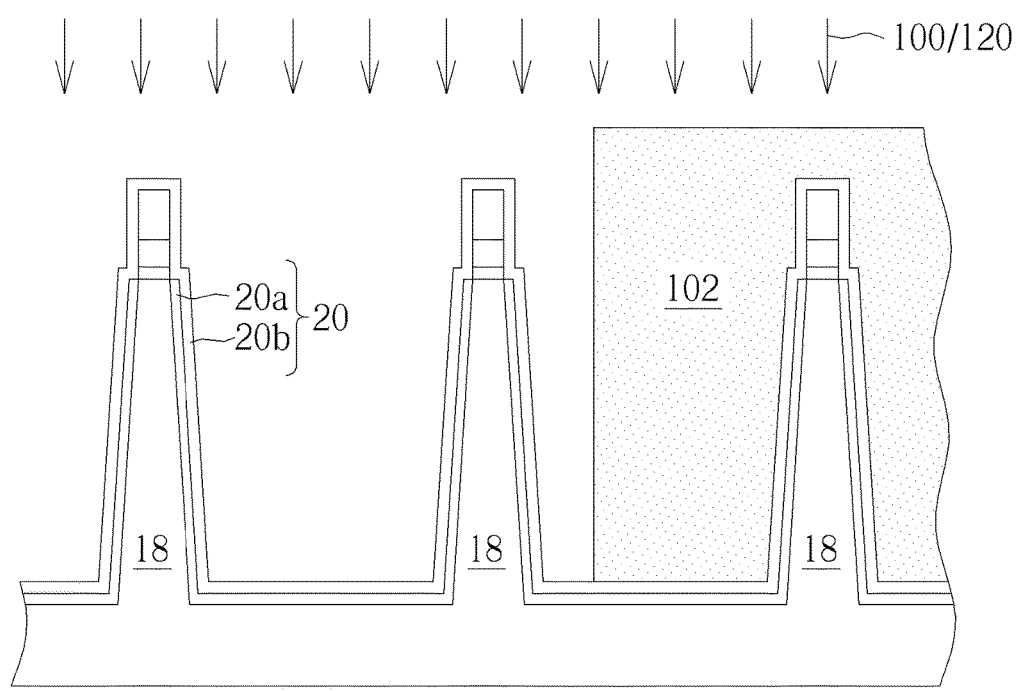

Please refer to FIG. 4. After forming the protecting layer 20 on the fins 18, at least an ion implantation 100 is performed. It should be noted that a patterned photoresist 102 can be formed on the substrate 10 to block the fins 18 from the ion implantation 100 as shown in FIG. 4. Those skilled in the art would easily realize that during the FinFET fabrication, different areas/fins are designated to form transistors of different conductivity types. Therefore, during the n-typed ion implantation, fins 18 designated to form the n-typed FinFET are exposed while the others are blocked by the patterned photoresist. Alternatively, during the p-typed ion implantation, fins 18 designated to form the p-typed FinFET are exposed while the others are blocked by the patterned photoresist. After the ion implantation 100, the patterned photoresist 102 is removed and a thermal process 120 is then performed to drive the p-typed and/or n-typed dopants into the fins 18.

Figure 5:
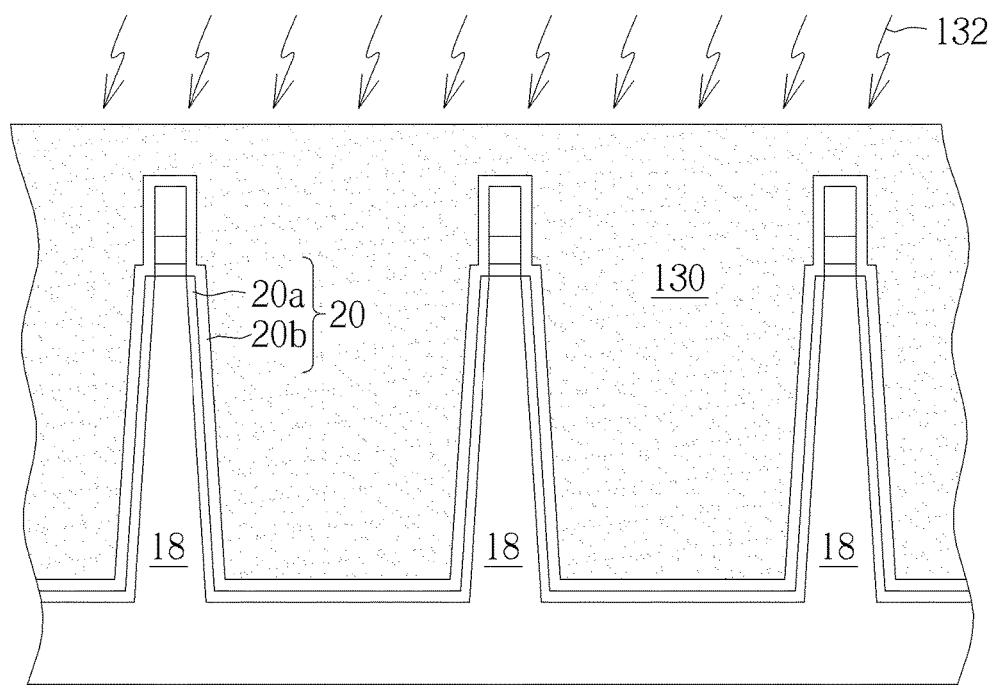

Please refer to FIG. 5. After the thermal process 120, an insulating layer 130 is formed on the substrate 10, and the fins 18 are embedded in the insulating layer 130 as shown in FIG. 5. The insulating layer 130 can be formed by performing a flowable chemical vapor deposition (hereinafter abbreviated as FCVD) 132, preferably a FCVD 132 of silicon oxide. It is known that the flowable film may be flowed into the trenches between neighboring fins 18, where it can be thermal cured in situ, thereby forming the insulating layer 130 over the substrate 10 without voids or spaces which may adversely affect the operation of the completed device, such as by trapping impurities within the insulating material. Briefly speaking, the insulating layer 130 is formed by the FCVD 132 to provide a good gap filling effect.

Figure 6:
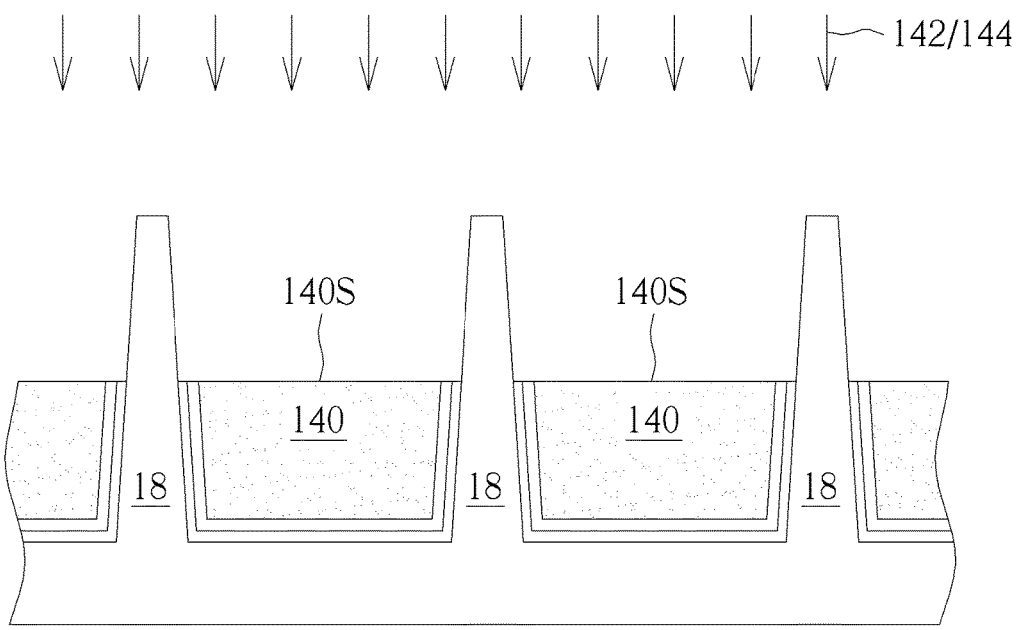

Please refer to FIG. 6. After forming the insulating layer 130 in which the fins 18 are embedded, a portion of the insulating layer 130 is removed to form an isolation structure 140 on the substrate 10. Specifically, a planarization process 142 is performed to remove a portion of the insulating layer 130 such that a top surface of the insulating layer 130 and top surfaces of the fins 18 are co-planar. An etching back process 144 is subsequently performed to further remove a portion of the insulating layer 130 to form the isolation structure 140. Additionally, the protecting layer 20 is also removed. It is noteworthy that the fins 18 are exposed from a top surface 140S of the isolation structure 140. And a gate electrode (not shown) can be subsequently formed and followed by forming other elements that constructing a FinFET.

As mentioned above, the insulating layer 130 is formed by the FCVD 132 and be thermal cured. It is found that the insulating layer may be shrunk during the thermal curing and thus stress may be generated. It is also found when the ion implantation and the thermal process are performed directly after the FCVD and the thermal curing, the stress is worsened to cause damages, and stacking fault is found in the fins. Therefore, the method for manufacturing the fins provided by the preferred embodiment is to perform the ion implantation 100 and the thermal process 120 before forming the insulating layer 130 by the FCVD 132. Thus the stress induced during the thermal curing of the FCVD 132 is not worsened, and consequently no stacking fault is found in the fins 18. In other words, stress that induced by the "insulating layer formation-to-ion implantation-to-thermal process" sequential procedure is prevented, therefore the stack fault caused by the stress is reduced and the vulnerable fins 18 are protected. Furthermore, the fins 18 with superior quality ensure the FinFET performance.

Figure 7:
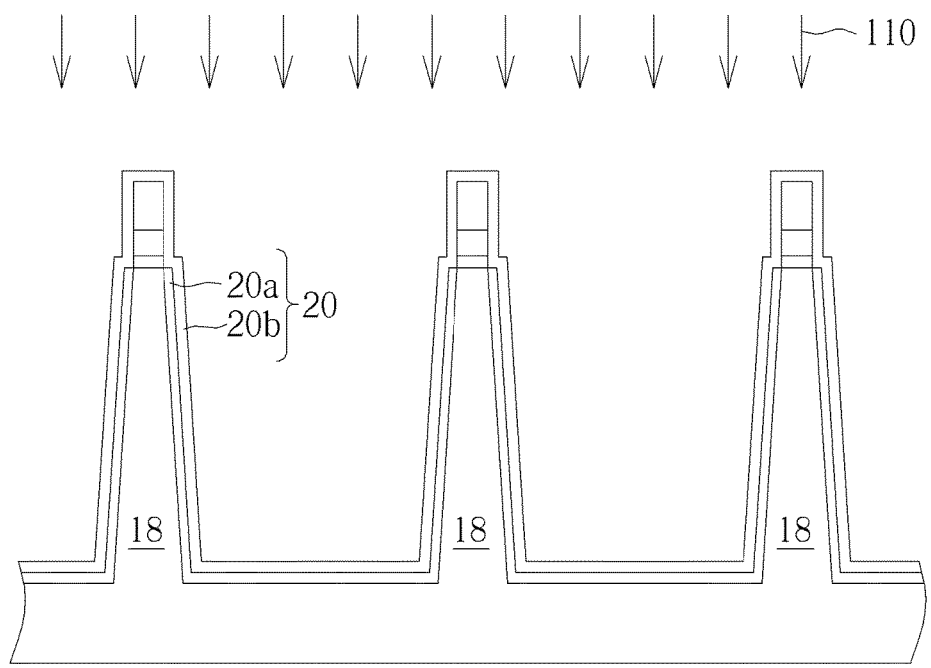
FIG. 7 is a schematic drawing illustrating a modification to the first preferred embodiment provided by the present invention.

Please refer to FIG. 7, which is a schematic drawing illustrating a modification to the first preferred embodiment provided by the present invention. According to the modification, a co-implant 110 is performed after the ion implantation 100 and before thermal process 120. As shown in FIG. 7, after performing the ion implantation 100, the patterned photoresist 102 is removed and followed by performing the co-implant 110. The co-implant 110 includes carbon (C), and a concentration of carbon in the co-implant 110 is smaller than 1E14, for example but not limited to, between 5E13 and 1E14. After the co-implant 110, the thermal process 120 is performed. It is found that the substitutional carbon introduced by the co-implant 110 is shown to act as a sink for silicon interstitials formed, preventing the clustering of silicon interstitials, and combining silicon interstitials to form a SiC complex gettering center, and thereby preventing end of range (herein after abbreviated as EOR) secondary defect formation. Consequently, stacking fault defect of the fins 18 is further reduced by the co-implant 110 between the ion implantation 100 and the thermal process 120.

Please refer to FIGS. 1-3 and 8-10, which are schematic drawings illustrating a method for manufacturing fins provided by a second preferred embodiment of the present invention. It should be noted that elements and the same in both of the first and second preferred embodiments are designated by the same numerals, and steps for forming those elements are depicted by FIGS. 1-3. Thus, thus details of those steps are omitted in the interest of brevity. Briefly speaking, according to the method for manufacturing fins provided by the second preferred embodiment, a substrate 10 is provided, and a plurality of mandrel patterns 14 are formed on the substrate 10. A plurality of spacer patterns 16 are then formed on sidewalls of the mandrel patterns 14 and followed by removing portions of the mandrel patterns 14, as shown in FIG. 1. As shown in FIG. 2, next, the substrate 10 is etched through the spacer patterns 16, and thus a plurality of fins 18 are formed on the substrate 10. After forming the fins 18, a first protecting film 20a is formed to cover surfaces of the fins 18. As shown in FIG. 3, a fin cutting process is then performed to selectively remove portions of the fins 18 from the substrate 10 and followed by forming a second protecting film 20b covering surfaces of the fins 18. Additionally, the first protecting film 20a and the second protecting film 20b construct a protecting layer 20 on the fins 18 as shown in FIG. 3. In other words, the present invention provides an oxide multilayer serving as the protecting layer 20.

Figure 8:
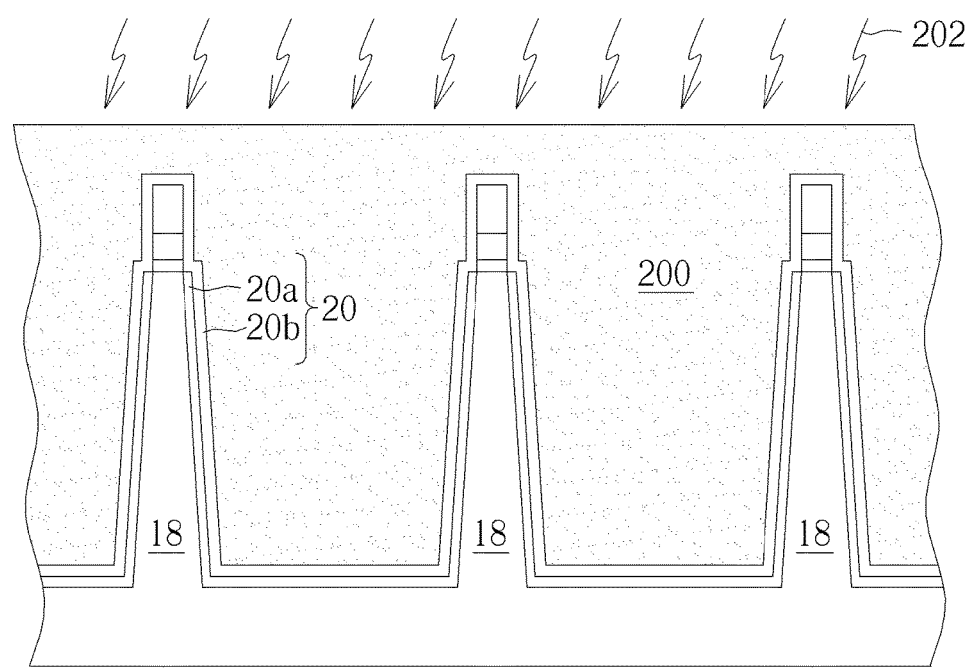

Please refer to FIG. 8 subsequent to FIG. 3. After forming the second protecting film 20b/the protecting layer 20, an insulating layer 200 is formed on the substrate 10, and the fins 18 are embedded in the insulating layer 200. The insulating layer 200 can be formed by performing a FCVD 202, preferably a FCVD 202 of silicon oxide. As mentioned above, the flowable film may be flowed into the trenches between neighboring fins 18, where it can be thermal cured in situ, thereby forming the insulating layer 200 over the substrate 10 without voids or spaces.

Figure 9:
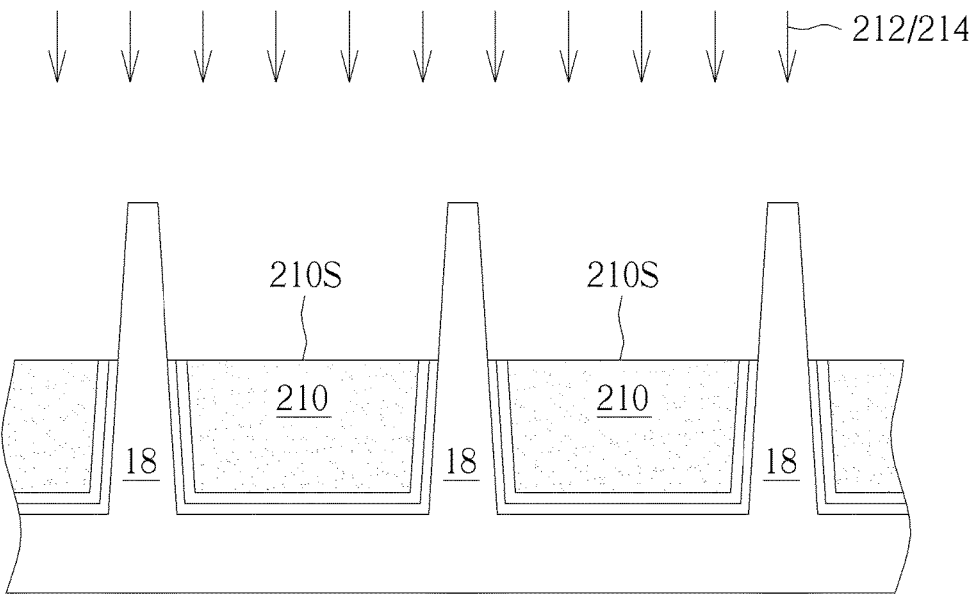

Please refer to FIG. 9. After forming the insulating layer 200 in which the fins 18 are embedded, a portion of the insulating layer 200 is removed to form an isolation structure 210 on the substrate 10. Specifically, a planarization process 212 is performed to remove a portion of the insulating layer 200 such that a top surface of the insulating layer 200 and top surfaces of the fins 18 are co-planar. And an etching back process 214 is subsequently performed to further remove a portion of the insulating layer 200 to form the isolation structure 210. Additionally, the protecting layer 20 is also removed. It is noteworthy that the fins 18 are exposed from a top surface 210S of the isolation structure 210.

Figure 10:
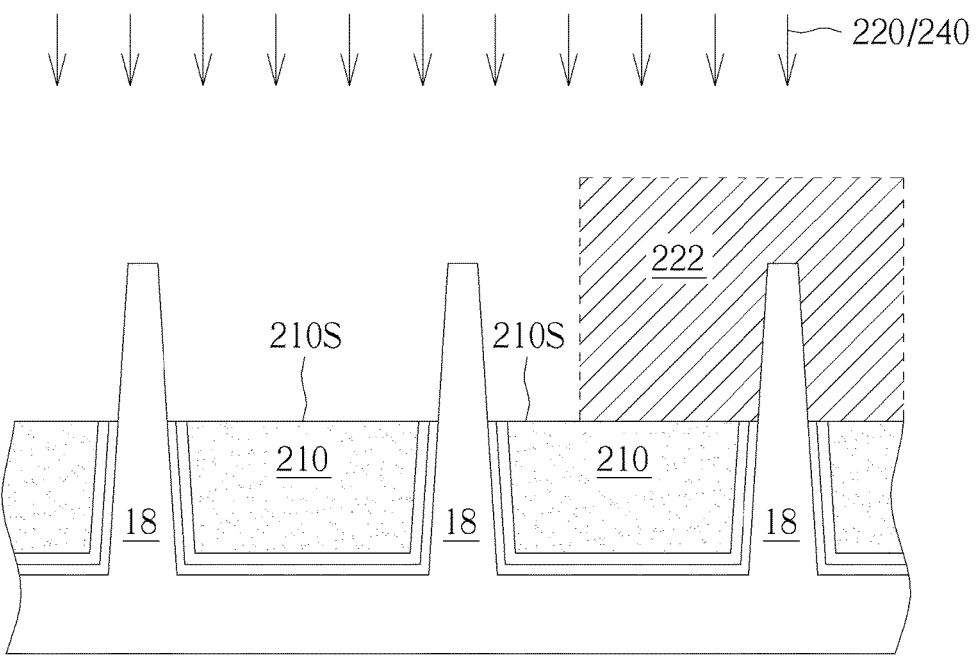

Please refer to FIG. 10. After forming the isolation structure 210 on the substrate 10, at least an ion implantation 220 is performed to the fins 18. It should be noted that a patterned photoresist 222 (shown by the dotted line) can be formed on the substrate 10 to block the fins 18 from the ion implantation 220 as shown in FIG. 10. As mentioned above, during the FinFET fabrication, different areas/fins are designated to form transistors of different conductivity types. Therefore, during the n-typed ion implantation, fins 18 designated to form the n-typed FinFET are exposed while the others are blocked by the patterned photoresist. Alternatively, during the p-typed ion implantation, fins 18 designated to form the p-typed FinFET are exposed while the others are blocked by the patterned photoresist.

Please still refer to FIG. 10. After the ion implantation 220, the patterned photoresist 222 is removed and a thermal process 240 is then performed to drive the p-typed and/or n-typed dopants into the fins 18. Thereafter, a gate electrode (not shown) can be subsequently formed and followed by forming other elements that constructing a FinFET.

As mentioned above, it is found that the insulating layer 200 may be shrunk during the thermal curing and thus stress may be generated. It is also found when the ion implantation and the thermal process are performed directly after the FCVD and the thermal curing, the stress is worsened to cause damages, and stacking fault is found in the fins. Therefore, the method for manufacturing the fins provided by the preferred embodiment is to perform the ion implantation 220 and the thermal process 240 after forming the isolation structure 210, which is obtained by removing the portion of the insulating layer 200. Thus the stress induced during the thermal curing of the FCVD 202 is not worsened, and consequently no stacking fault is found in the fins. 18. In other words, stress that induced by the "insulating layer formation-to-ion implantation-to-thermal process" sequential procedure is prevented, therefore the stack fault caused by the stress is reduced and the vulnerable fins 18 are protected. Furthermore, the fins 18 with superior quality ensure the FinFET performance.

Figure 11:
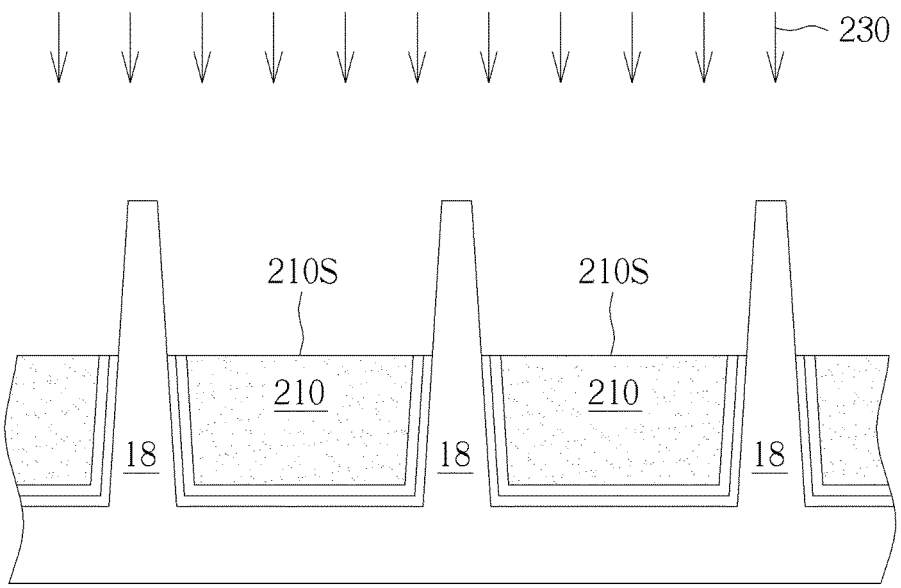
FIG. 11 is a schematic drawing illustrating a modification to the second preferred embodiment provided by the present invention.

Please refer to FIG. 11, which is a schematic drawing illustrating a modification to the second preferred embodiment provided by the present invention. According to the modification, a co-implant 230 is performed after the ion implantation 220 and before the thermal process 240. As shown in FIG. 11, after performing the ion implantation 220, the patterned photoresist 222 is removed and followed by performing the co-implant 230. The co-implant 230 includes carbon, and a concentration of carbon in the co-implant 230 is smaller than 1E14, for example but not limited to, between 5E13 and 1E14. After the co-implant 230, the thermal process 240 is performed. As mentioned above, the substitutional carbon introduced by the co-implant 230 is shown to act as a sink for silicon interstitials formed, preventing the clustering of silicon interstitials, and combining silicon interstitials to form a SiC complex gettering center, and thereby preventing EOR secondary defect formation. Consequently, stacking fault defect of the fins 18 is further reduced by the co-implant 230 between the ion implantation 220 and the thermal process 240.

Please refer to FIGS. 1-3 and 12-15, which are schematic drawings illustrating a method for manufacturing fins provided by a third preferred embodiment of the present invention. It should be noted that elements and the same in the aforementioned embodiments and the third embodiment are designated by the same numerals, and steps for forming those elements are depicted by FIGS. 1-3. Thus, thus details of those steps are omitted in the interest of brevity. Please refer to FIG. 12 subsequent to FIG. 3. After forming the second protecting film 20b/the protecting layer 20, an insulating layer 300 is formed on the substrate 10, and the fins 18 are embedded in the insulating layer 300. The insulating layer 300 can be formed by performing a FCVD 302, preferably a FCVD 302 of silicon oxide. As mentioned above, the flowable film may be flowed into the trenches between neighboring fins 18, where it can be thermal cured in situ, thereby forming the insulating layer 300 over the substrate 10 without voids or spaces.

Figure 13:
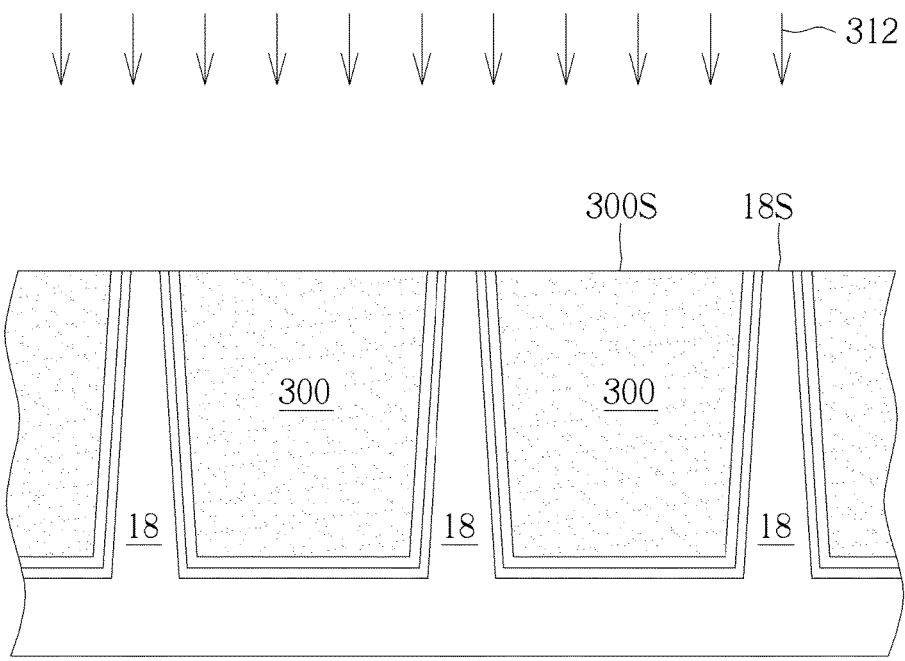

Please refer to FIG. 13. After forming the insulating layer 300, a planarization process 312 is performed to remove a portion of the insulating layer 300. Consequently, a top surface 300S of the insulating layer 300 and top surfaces 18S of the fins 18 are coplanar.

Figure 12:
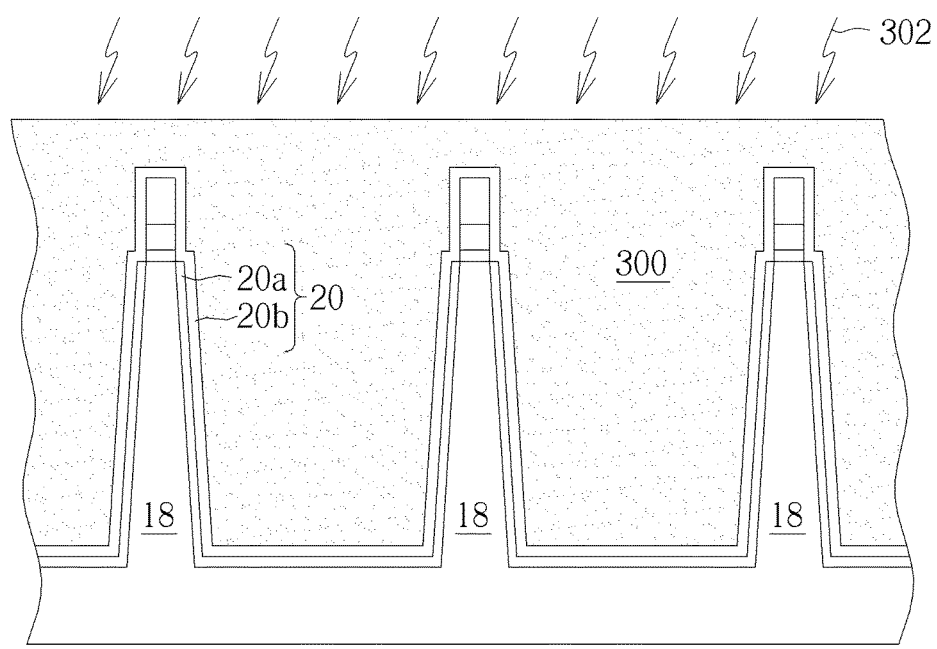
Figure 14:
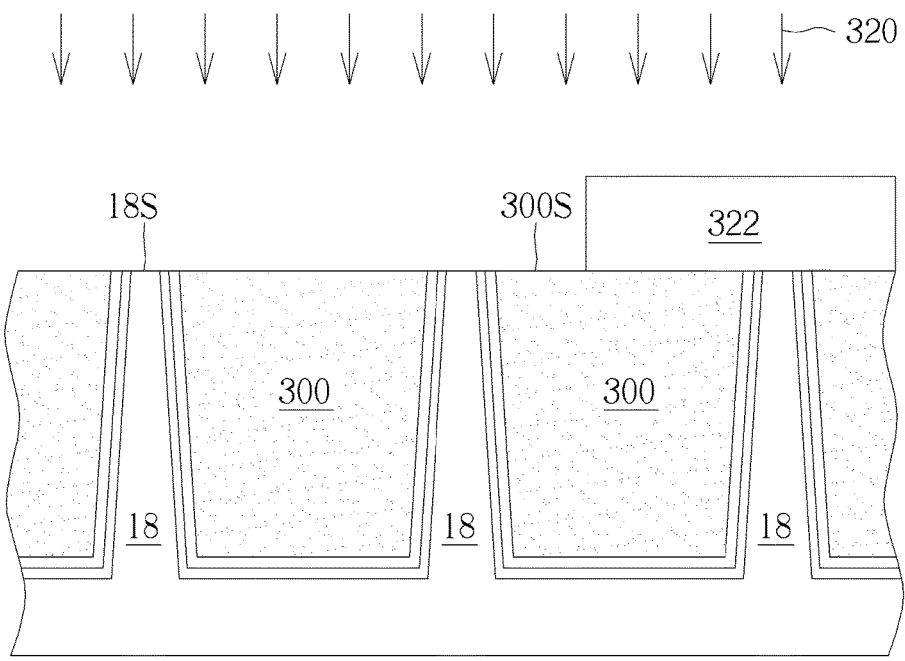

Please refer to FIG. 14. After the planarization process 312, at least an ion implantation 320 is performed to the fins 18. It should be noted that a patterned photoresist 322 can be formed on the substrate 10 to block the fins 18 from the ion implantation 320 as shown in FIG. 12. As mentioned above, during the FinFET fabrication, different areas/fins are designated to form transistors of different conductivity types. Therefore, during the n-typed ion implantation, fins 18 designated to form the n-typed FinFET are exposed while the others are blocked by the patterned photoresist. Alternatively, during the p-typed ion implantation, fins 18 designated to form the p-typed FinFET are exposed while the others are blocked by the patterned photoresist.

Figure 15:
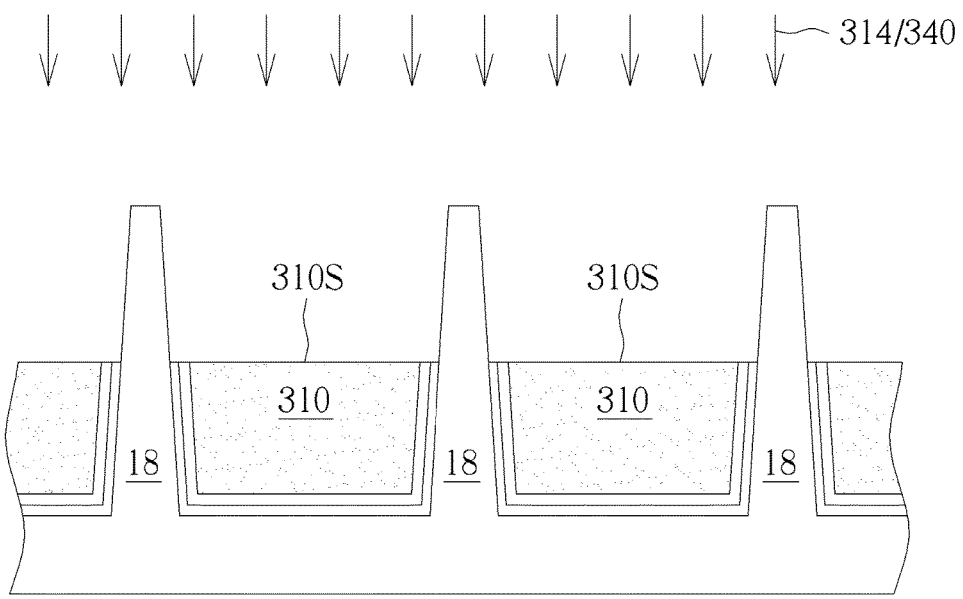

Please refer to FIG. 15. After the ion implantation 300, the patterned photoresist 302 is removed and followed by performing an etching back process 314. As shown in FIG. 15, the etching back process 314 is performed to remove a portion of the insulating layer 300 to form an isolation structure 310. More important, the fins 18 are exposed from a top surface 310S of the isolation structure 310. After forming the isolation structure 310, a thermal process 340 is performed to drive the p-typed and/or n-typed dopants into the fins 18. Thereafter, a gate electrode (not shown) can be subsequently formed and followed by forming other elements that constructing a FinFET.

According to the method for manufacturing the fins provided by the preferred embodiment, the ion implantation 320 is performed after forming the insulating layer 300, and the thermal process 340 is performed after forming the isolation structure 310, which is obtained by removing the portion of the insulating layer 300. Thus the stress induced during the thermal curing of the FCVD 302 is not worsened, and consequently no stacking fault is found in the fins 18. In other words, stress that induced by the "insulating layer formation-to-ion implantation-to-thermal process" sequential procedure is prevented, therefore the stack fault caused by the stress is reduced and the vulnerable fins 18 are protected. Furthermore, the fins 18 with superior quality ensure the FinFET performance.

Figure 16:
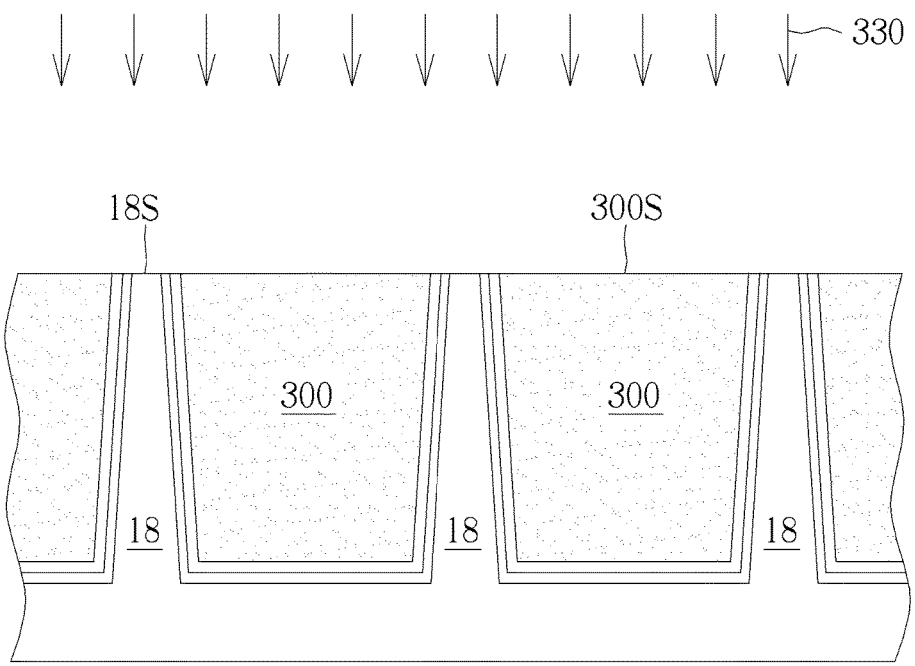
FIG. 16 is a schematic drawing illustrating a modification to the third preferred embodiment.

Please refer to FIG. 16, which is a schematic drawing illustrating a modification to the third preferred embodiment provided by the present invention. According to the modification, a co-implant 330 is performed after the ion implantation 320 and before the thermal process 340. As shown in FIG. 16, after performing the ion implantation 320, the patterned photoresist 322 is removed and followed by performing the co-implant 330. The co-implant 330 includes carbon, and a concentration of carbon in the co-implant 330 is smaller than 1E14, for example but not limited to, between 5E13 and 1E14. After the co-implant 330, the formation of the isolation structure 310 and the thermal process 340 are sequentially performed. As mentioned above, the substitutional carbon introduced by the co-implant 330 is shown to act as a sink for silicon interstitials formed, preventing the clustering of silicon interstitials, and combining silicon interstitials to forma SiC complex gettering center, and thereby preventing EOR secondary defect formation. Consequently, stacking fault defect of the fins 18 is further reduced by the co-implant 330 between the ion implantation 320 and the thermal process 340.

According to the methods for manufacturing the fins provided by the present invention, the insulating layer is formed after the ion implantation and the thermal process. Or, the isolation structure is formed before the ion implantation, or between the ion implantation and the thermal process. Consequently, stress generated by the "insulating layer formation-to-ion implantation-to-thermal process" sequential procedure is prevented. Furthermore, the carbon co-implant can always be introduced between the ion implantation and the thermal process to further reduce stacking fault. Consequently, stack fault is reduced and thus the vulnerable fins are protected, and the fins with superior quality ensure the FinFET performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing fins comprising:
   providing a substrate comprising a plurality of fins formed thereon;
   performing at least an ion implantation to the fins;
   performing a thermal process after the implantation;
   forming an insulating layer on the substrate after the thermal process, and the fins being embedded in the insulating layer; and
   removing a portion of the insulating layer to form an isolation structure on the substrate, and the fins being exposed from a top surface of the isolation structure.

2. The method for manufacturing the fins according to claim 1, further comprising:
   forming at least a mandrel pattern on the substrate;
   forming a plurality of spacer patterns on sidewalls of the mandrel pattern on the substrate;
   etching the substrate through the spacer pattern to form the fins; and
   removing portions of the fins.

3. The method for manufacturing the fins according to claim 1, further comprising forming a protecting layer on the fins before the ion implantation.

4. The method for manufacturing the fins according to claim 3, wherein the protecting layer comprises an oxide multilayer.

5. The method for manufacturing the fins according to claim 1, further comprising performing a co-implant after the ion implantation and before the thermal process.

6. The method for manufacturing the fins according to claim 5, wherein the co-implant comprises carbon (C).

7. The method for manufacturing the fins according to claim 6, wherein a concentration of carbon in the co-implant is smaller than 1E14.

8. The method for manufacturing the fins according to claim 1, wherein the insulating layer is formed by a flowable chemical vapor deposition (FCVD).

\* \* \* \* \*